United States Patent [19]

Esproles

[11] Patent Number: 5,345,168
[45] Date of Patent: Sep. 6, 1994

[54] BURST-BY-BURST LASER FREQUENCY MONITOR

[75] Inventor: Carlos Esproles, Pasadena, Calif.

[73] Assignee: The United States of America as represented by the Administrator of the National Aeronautics and Space Administration, Washington, D.C.

[21] Appl. No.: 23,252

[22] Filed: Feb. 1, 1993

[51] Int. Cl.$^5$ .............................................. G01R 23/02
[52] U.S. Cl. ............................ 324/76.48; 324/76.62; 377/42
[58] Field of Search ......................... 345/47, 48, 62, 64; 377/42; 324/161, 76.48, 76.47, 76.62

[56] References Cited

U.S. PATENT DOCUMENTS

| | | | |
|---|---|---|---|
| 4,137,496 | 1/1976 | Lind | 324/76.48 |
| 4,273,023 | 6/1981 | Mercer | 324/76.48 |
| 4,329,664 | 5/1982 | Javan . | |
| 4,341,995 | 7/1982 | Hennick | 324/161 |
| 4,472,775 | 9/1984 | Mizuno | 324/161 |
| 4,523,506 | 6/1985 | Hollimon | 324/76.57 |
| 4,906,092 | 3/1990 | O'Meara . | |
| 4,915,499 | 4/1990 | Gidon et al. . | |
| 4,979,816 | 12/1990 | White . | |
| 5,006,813 | 4/1991 | Khoshnevisan et al. . | |
| 5,029,999 | 7/1991 | Kremer et al. . | |
| 5,102,219 | 4/1992 | Skagerlund . | |
| 5,102,220 | 4/1992 | Tiedeke . | |

*Primary Examiner*—Walter E. Snow
*Assistant Examiner*—Jose M. Solis
*Attorney, Agent, or Firm*—John H. Kusmiss; Thomas H. Jones; Guy M. Miller

[57] ABSTRACT

A frequency monitoring system constructed of a rack mountable instrument for monitoring laser pulse frequency. The pulsed laser frequency is displayed on a linear bar-graph array composed of Light Emitting Diodes (LED's). The display is calibrated so that each LED represents a radio frequency (RF). When the transmitter laser pulses, the laser pulse is reflected by the target object and detected by the receiver and amplified. A small amount of the laser pulse transmitted is detected and mixed with a stable local oscillator signal to produce an RF burst that is sent to the frequency monitor and converted to TTL levels with a high-speed TTL voltage comparator. The TTL signal is fed into the clock input of a binary counter which is cleared and gated by a synch pulse from the transmitter. The output of the binary counter is sent to a digital to analog converter which converts it into an output voltage that is in turn amplified and used as reference points for LED dot/bar driver IC's. The LED drivers provide input for the linear array of LED's selected to operate in a bar length mode or a moving dot mode.

2 Claims, 2 Drawing Sheets

BURST-BY-BURST LASER FREQUENCY MONITOR

ORIGIN OF INVENTION

The invention described herein was made in the performance of work under a NASA contract, and is subject to the provisions of Public Law 96-517 (35 USC 202) in which the contractor has elected not to retain title.

TECHNICAL FIELD

The invention relates to a system for real-time frequency monitoring and display of an RF burst where the burst frequency is analyzed and displayed on a burst-by-burst basis in order to allow for burst frequency control on a burst-by-burst basis.

BACKGROUND ART

The need for coherent laser infrared radar (LIDAR) transmitters to maintain single-mode operation within a narrow frequency spectrum has stimulated the development of the present invention. Although LIDAR systems operating at wavelengths in the mid-IR region of the spectrum are to be preferred in many applications for eye safety, application of the present invention is by no means limited to lasers in the IR region, or for that matter to LIDAR systems.

Coherent LIDAR technology has been used for the profiling of aerosol and cloud backscatter, Doppler wind field measurements, and the measurement of atmospheric trace species. For example, during the NASA Global Backscatter Experiment Missions of 1989 and 1990, the Jet Propulsion Laboratory Airborne Backscatter LIDAR used a TEA-$CO_2$ pulsed laser as its transmitter.

Coherent detection was used in order to achieve the sensitivity necessary to measure low backscatter coefficients at ranges of several kilometers, and a narrow bandwidth (10 MHz) electronics were used in the receiver chain to reduce total noise, thereby enhancing the signal-to-noise ratio and to suppress signal frequencies exceeding the sample rate parameters of the system digitizers.

Single-mode operation of the laser transmitter in the airborne backscatter LIDAR system is achieved by employing the technique of injection seeding. Depending on the injection intensity and transmitter pulsed laser cavity length, the injection zone of the pulsed laser can typically scan a frequency range of up to 15 MHz.

In order to maintain the pulsed laser frequency within the narrow bandwidth of the electronics, a transmitter stabilization loop is used. The transmitter stabilization loop uses a manually operated offset potentiometer to fine tune the pulsed laser frequency. The single-mode injection detuning zone is determined with respect to the offset potentiometer. During past operations, this potentiometer was manually adjusted to the midregion of the injection locking zone in order to insure that the transmitter frequency was within the receiver passband.

Although the stabilization loop keeps the burst frequency within the receiver passband, there was no way of insuring that the laser transmitter would be centered within this bandpass region on a burst-by-burst basis. Centering the pulse laser frequency in the receiver passband would optimize the signal-to-noise ratio and also avoid small but not insignificant signal variations which could effect the system calibration in a manner difficult to quantify.

Since the major objective of the GLOBE missions on a DC-8 research aircraft was quantitative measurement of aerosol and cloud backscatter, calibration and instrument stability were of utmost importance. Consequently, it is necessary to monitor the laser pulse frequency with respect to a local oscillator, i.e., to monitor the RF signal from a heterodyne receiver and make "fine tune" adjustments through the offset potentiometer in the stabilization loop to adjust the laser frequency in the mid-IR region ($\lambda > 1.5 \mu m$) as necessary to maintain the RF signal within a narrow band on a pulse-by-pulse basis.

Frequency counters and spectrum analyzers that measure frequency are available, but they are unsuitable for this particular purpose. This is primarily because of the high laser pulse rate and short burst frequency variations of each laser burst which are too rapid for real-time observation. Therefore, an object of this invention is to provide a burst-by-burst frequency monitoring system and display system for real-time observation.

STATEMENT OF THE INVENTION

In accordance with the present invention an RF burst frequency is analyzed and displayed on a bargraph array of light emitting diodes (LED's) The LED array is calibrated such that each LED represents a radio frequency with a 1 MHz resolution, and the array is calibrated with the center of the array denoting the center of the desired RF bandwidth. The LED's are color coded to delineate that RF bandpass. During each successive RF burst, a single LED will be illuminated indicating the frequency of the burst. An operator may then readily observe the frequency bar graph and make the necessary potentiometer adjustment on the transmitter frequency that is heterodyned with the frequency of a stable local oscillator to produce the RF bursts being observed and adjusted to the center of the bandpass region of the receiver.

The RF burst frequency analyzer comprises a high-speed binary counter for counting cycles of the RF signal per unit time. The counter is reset by a transmitter synch pulse each time a burst of energy is transmitted and heterodyned to produce the aforesaid RF frequency burst and thereafter gates the counter for the aforesaid unit of time. The count reached at the end of that unit time is a measure of the RF burst frequency. That count is stored by the counter until a following synch pulse is received. In the meantime, a digital-to-analog converter converts the digital output of the counter to an analog signal that is directly related to the laser frequency. A bar-graph display means responds to the analog signal to selectively activate light-emitting diodes of an array. The display means thus comprises a linear array of light emitting diodes and a display driver means for providing in the linear array a bar array graph, or a moving dot display, where the position of the dot is directly related to the amplitude of the analog signal. In a bar-graph display, the length of the array of diodes that are actuated is directly related to the amplitude of the analog signal. The display driver is preferably coupled to the linear array of light emitting diodes through optoelectronic couplers, one such coupler for each light-emitting diode.

The novel features that are considered characteristic of this invention are set forth with particularity in the appended claims. The invention will best be understood

DETAILED DESCRIPTION OF THE INVENTION

LIDAR transmitters and receivers, such as the aforesaid Airborne Backscatter LIDAR system, downconvert optical laser pulses to radio frequency (RF) bursts lasting slightly longer than 1 microsecond. This RF burst is then isolated, amplified and sent to the frequency monitor.

Figure 2:
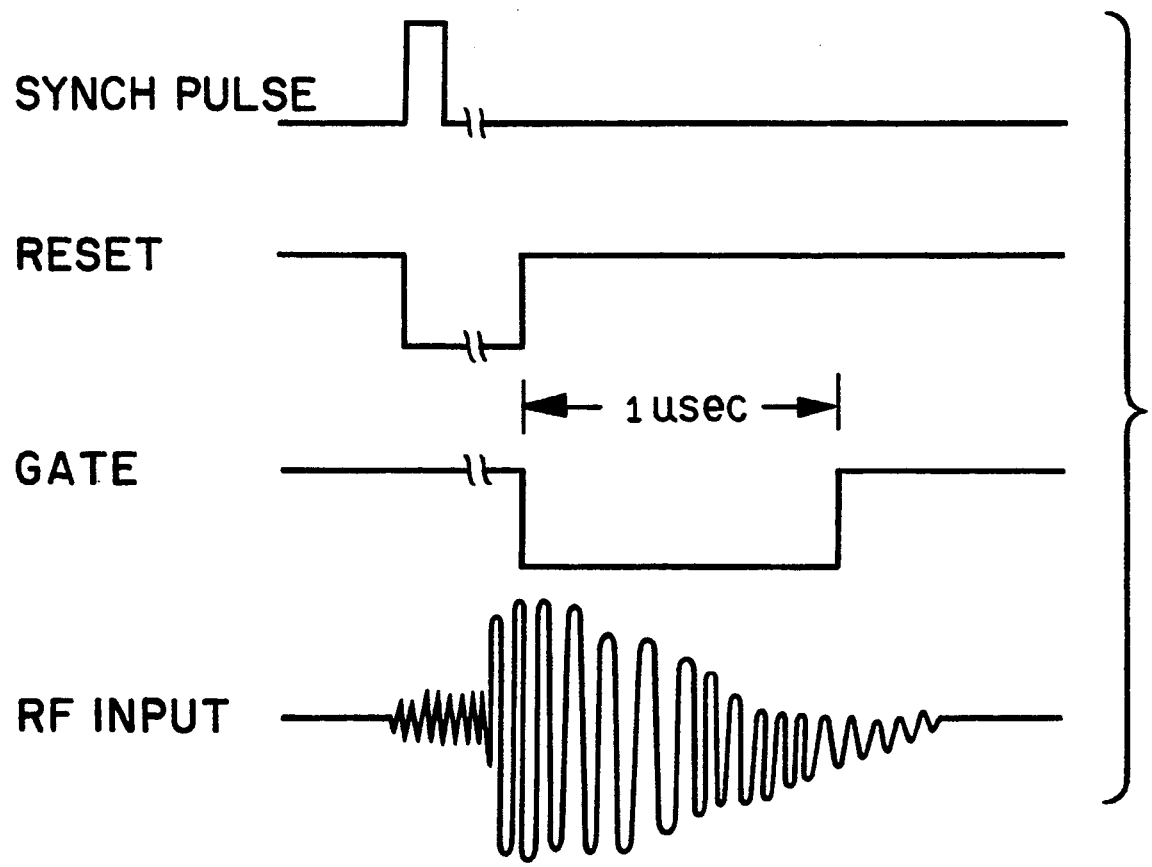
FIG. 2 is a circuit timing diagram for operation of the present invention.

The frequency monitor shown in FIG. I converts the RF burst into TTL levels using high-speed TTL voltage comparator 10. Because of the high frequency of the RF mixing, very high speed logic is needed to count cycles of the RF bursts, such as the 74F or AS series logic. The TTL signal is then fed into the clock input of a binary counter 12 which is first reset and then gated for a unit time of $1\mu s$ to count while the RF burst is present. An external synch pulse from the transmitter (not shown) at a terminal 14 precedes the RF burst as shown in FIG. 2. That synch pulse is produced by the voltage transient of the discharge of the transmitter laser and is used to trigger two multivibrators 16a and 16b in cascade. The multivibrator 16a resets the counter, and when the multivibrator resets it triggers the multivibrator 16b to produce a synch pulse as shown in FIG. 2. The gate pulse gates the counter 12 for a period of $1\mu s$ during which time it counts the input RF signal cycles. The counter value is indicative of the pulse laser frequency for that burst. The binary counter 12 will maintain this count as an 8-bit binary output until the next laser pulse resets the counter to zero, and the process is repeated for another RF burst.

Figure 1:
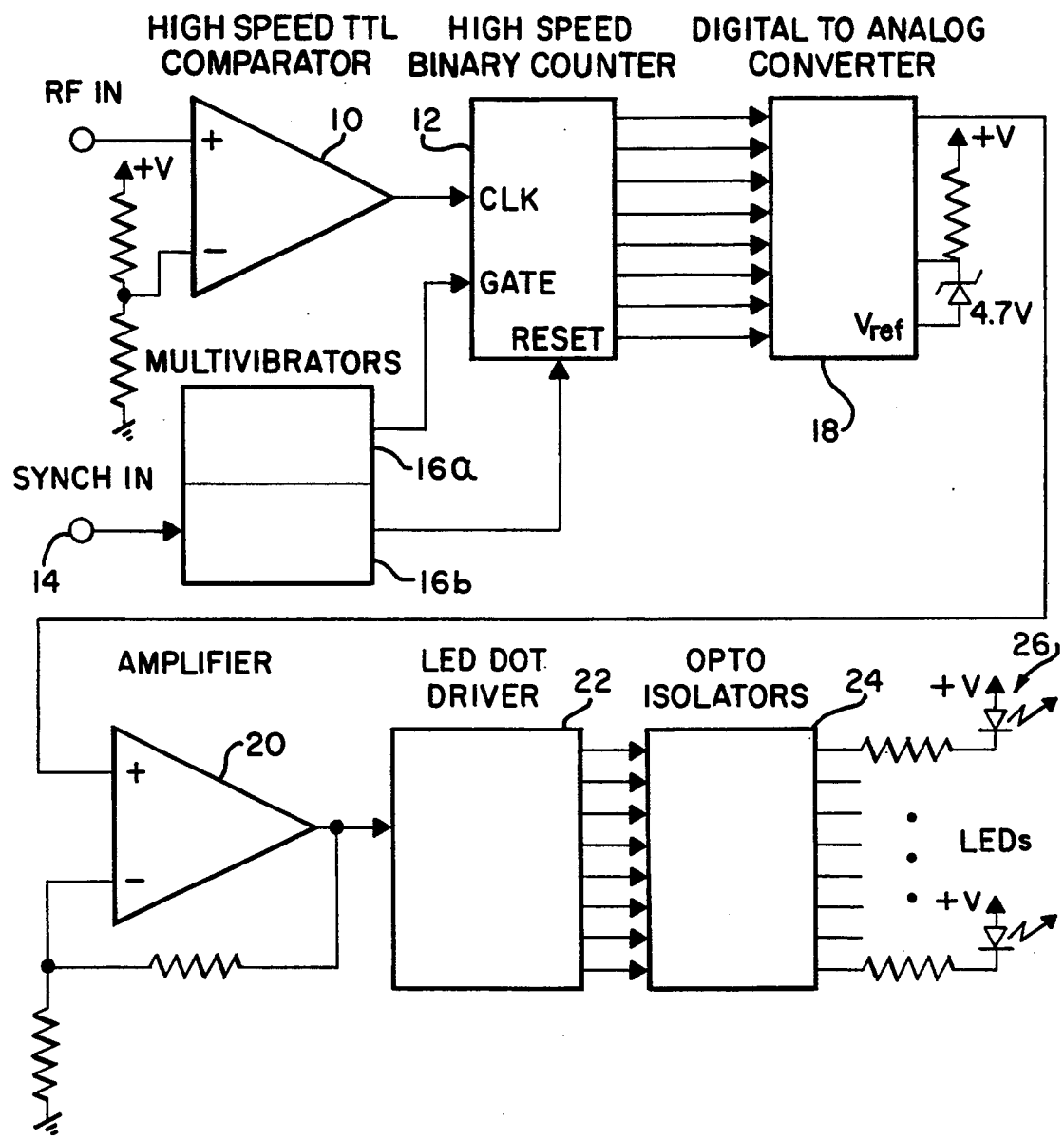
FIG. 1 is a schematic diagram of the present invention.

The binary output of the counter 12 is coupled into a digital-to-analog converter 18 which is set to full-scale output reference voltage. As in typical digital-to-analog applications, the output voltage of the digital-to-analog converter 18 is proportional to the magnitude of the binary input which in this case is the RF input frequency that is directly related to the laser transmitter frequency since some of the laser output beam reflected from the fringe of the beam back into a receiver (not shown except for the frequency monitor and display unit shown in FIG. 1 that is housed with both the laser transmitter and backscatter receiver) is heterodyned with a stable local oscillator frequency to produce the RF input shown in FIG. 2. (The receiver housed with the transmitter is gated off during the laser pulse transmit; only the backscattered laser pulse is of interest in an instrument of this type.) The output of the digital to analog converter 18 is then coupled by an amplifier 20 so as to yield a low-to-high range suitable for input to an LED dot/bar driver 22. Outputs of the dot/bar driver 22 are then coupled through optoelectronic isolators 24 to a linear dot/bar graph array 26 of LED's.

Pulsed LIDAR transmitters emit powerful electromagnetic interference (EMI) bursts which can interfere with the binary counter 12 unless precautions are taken. Therefore, the frequency monitor is housed in a RF shielding enclosure and all DC lines are filtered.

Figure 3:
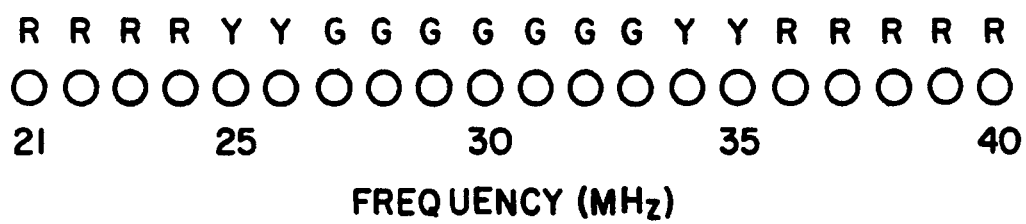
FIG. 3 is a schematic view of the linear bargraph array of LED's.

The LED dot/bar driver 22 is a monolithic integrated circuit LM3914 commercially available from National Semiconductor Corporation. It senses analog voltage levels and drives 10 LEDs in either a dot or bar display mode as selected through one pin which changes the display from a moving dot to a bar-graph display. For the present invention, a dot display of 20 LEDs is preferred. That is provided by cascading two LM3914s that drive 10 LEDs each. For this moving dot selection, the LEDs are color coded as shown in FIG. 3 so that both color and position is meaningful to the operator who manually adjusts a potentiometer in the transmitter (not shown) to continually adjust the laser frequency to the center of the RF frequency band. Since the RF bears a direct relationship to the laser frequency, the operator can manually stabilize the laser frequency as the frequency monitor analyzes the laser frequency in real time on a pulse-to-pulse basis of the laser through analysis of the RF input on a burst-to-burst basis.

Although particular embodiments of the invention have been described and illustrated herein, it is recognized that modifications and variations may readily occur to those skilled in the art. Consequently, it is intended that the claims be interpreted to cover such modifications and variations.

I claim:

1. A burst-by-burst RF frequency jitter monitoring device comprising, a binary counter having clock, reset and gate input terminals, a voltage comparator coupling an RF signal to said clock input of said binary counter, a multivibrator timing means having a synchronizing trigger input electronically connected to first reset said binary counter and then enable gate input terminals of said binary counter such that said binary counter is reset clear of any previous count and then enabled to count cycles of said RF signal from said voltage comparator for a fixed unit of time, a digital-to-analog converter connected to said binary counter to provide an analog output signal proportional to a binary count stored in said counter after said fixed unit of time following a trigger input, a linear array of light-emitting diodes, a light-emitting diode bar/dot driver responsive to said analog output for turning on said diodes in sequence from one end of said array to the other as said output voltage increases from a predetermined minimum to a predetermined maximum in a display mode selected from a moving dot mode and a bar length mode, whereby visual display of a rapidly moving dot position or bar length provides a visual indication of frequency jitter.

2. A device as described in claim 1, wherein said dot mode of display is selected and said light-emitting diodes are color coded.

* * * * *